(12) United States Patent
Kim et al.

(10) Patent No.: US 10,389,252 B2
(45) Date of Patent: Aug. 20, 2019

(54) APPARATUS FOR CONVERTING DC POWER

(71) Applicant: LG ELECTRONICS INC., Seoul (KR)

(72) Inventors: Sanghyeon Kim, Seoul (KR); Taeyoung Park, Seoul (KR); Jeongeon Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/821,967

(22) Filed: Nov. 24, 2017

(65) Prior Publication Data

US 2018/0152108 A1    May 31, 2018

(30) Foreign Application Priority Data

Nov. 30, 2016  (KR) .......................... 10-2016-0162000

(51) Int. Cl.
*H02M 3/335*    (2006.01)
*H01F 27/24*    (2006.01)
(Continued)

(52) U.S. Cl.
CPC ............ *H02M 3/335* (2013.01); *H01F 27/24* (2013.01); *H01F 27/2804* (2013.01);
(Continued)

(58) Field of Classification Search
CPC .......... H02M 3/22; H02M 3/24; H02M 3/325; H02M 3/335; H02M 3/28; H02M 3/33569; H02M 3/338; H02M 3/3381
See application file for complete search history.

(56) References Cited

U.S. PATENT DOCUMENTS 5,852,558 A * 12/1998 Julian ..................... H02M 1/12
                                                   363/132
2013/0003424 A1 * 1/2013 Song .................. H02M 3/33584
                                                   363/21.04
(Continued)

FOREIGN PATENT DOCUMENTS

EP          2 600 512      6/2013
JP          2012-231616    11/2012
(Continued)

OTHER PUBLICATIONS

Jacobs et al: "Multi-Phase Series Resonant DC-to-DC Converters: Transient Investigations", Power Electronics Specialists Conference, 2005. PESC '05. IEEE 36th, IEEE, Piscataway, NJ, Jan. 1, 2005, pp. 1972-1978, XP031000414.
(Continued)

*Primary Examiner* — Adolf D Berhane
*Assistant Examiner* — Afework S Demisse
(74) *Attorney, Agent, or Firm* — Ked & Associates, LLP

(57) ABSTRACT

Provided are a power converting system and a power converting apparatus, which include an input unit that receives a direct current (DC) voltage from an external power source, a conversion unit including a plurality of switching circuits that convert the input DC voltage into a multi-phase AC voltage, a resonant unit including a single resonant inductor connected to each of the plurality of switching circuits, and an output unit that rectifies each phase of the multi-phase AC voltage which has been converted in the plurality of switching circuits and outputs a single DC voltage.

13 Claims, 10 Drawing Sheets

(51) Int. Cl.
*H01F 27/28* (2006.01)
*H02M 1/08* (2006.01)
*H05K 1/09* (2006.01)
*H05K 1/16* (2006.01)
*H05K 1/18* (2006.01)
*H02M 3/158* (2006.01)
*H02M 1/00* (2006.01)

(52) U.S. Cl.
CPC ........... *H02M 1/08* (2013.01); *H02M 3/1584* (2013.01); *H05K 1/09* (2013.01); *H05K 1/165* (2013.01); *H05K 1/18* (2013.01); *H01F 2027/2809* (2013.01); *H02M 2001/0058* (2013.01); *H02M 2003/1586* (2013.01); *H05K 2201/10015* (2013.01); *Y02B 70/1425* (2013.01); *Y02B 70/1491* (2013.01)

(56) References Cited

U.S. PATENT DOCUMENTS

2013/0328394 A1   12/2013   Guittonneau
2015/0180350 A1*  6/2015    Huang ................. H02J 7/0068
                                                307/66
2015/0349562 A1*  12/2015   Minegishi ......... H02M 3/33507
                                                320/107
2018/0138801 A1*  5/2018    Chen .................... H02M 7/003

FOREIGN PATENT DOCUMENTS

JP    2013-158239    8/2013
JP    2015-046978    3/2015
KR    10-0799446     1/2008

OTHER PUBLICATIONS

S. Park et al: "Soft-Switched Interleaved Boost Converters for High Step-Up and High-Power Applications", IEEE Transactions on Power Electronics, vol. 26, No. 10, Oct. 2011, pp. 2906-2914.
European Search Report dated Mar. 6, 2018 issued in Application No. 17204132.9.
Korean Office Action dated Apr. 23, 2018 issued in Application No. 10-2016-0162000.
Korean Notice of Allowance dated Oct. 10, 2018 issued in Application No. 10-2016-0162000.

* cited by examiner

APPARATUS FOR CONVERTING DC POWER

CROSS-REFERENCE TO RELATED APPLICATION(S)

This application claims priority under 35 U.S.C. § 119 to Korean Application No. 10-2016-0162000, filed on Nov. 30, 2016, whose entire disclosure is hereby incorporated by reference.

BACKGROUND

1. Field

The present disclosure relates to a power converting system and a power converting apparatus, and particularly, to a multi-phase DC boosting power converting system and apparatus including a resonant inductor.

2. Background

Power converting systems and power converting apparatuses are known. However, they suffer from various disadvantages.

BRIEF DESCRIPTION OF THE DRAWINGS

The embodiments will be described in detail with reference to the following drawings in which like reference numerals refer to like elements wherein.

DETAILED DESCRIPTION

Figure 1:
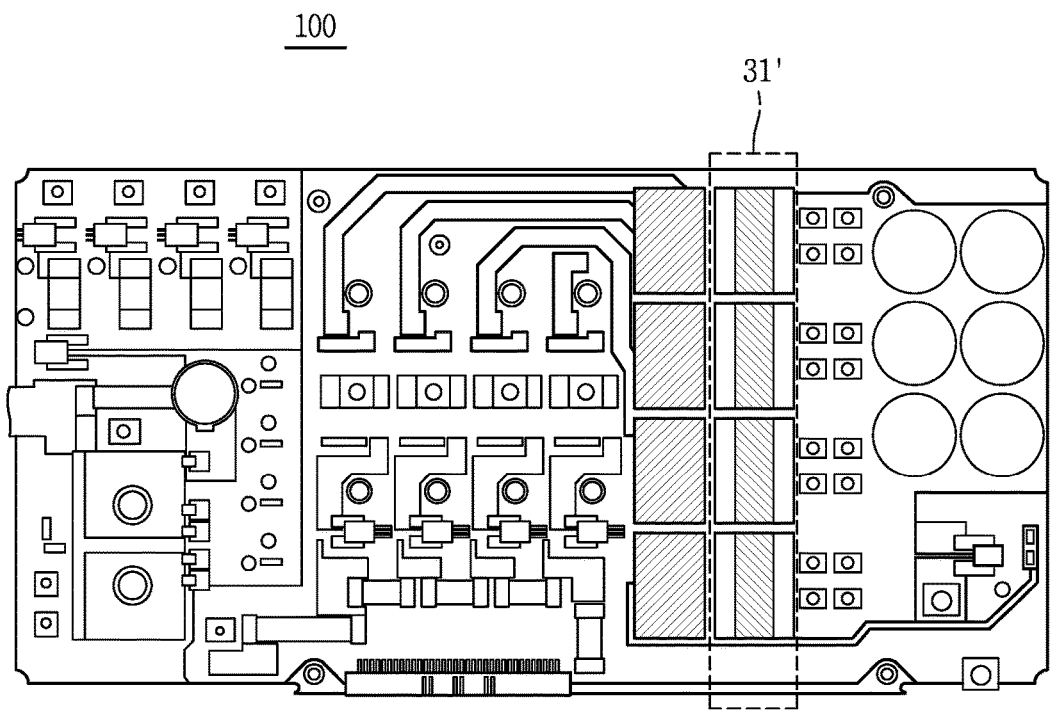
FIG. 1 is a view illustrating components on a printed circuit board (PCB) of a power converting apparatus of one embodiment.

Description will now be given in detail of the exemplary embodiments, with reference to the accompanying drawings. For the sake of brief description with reference to the drawings, the same or equivalent components will be provided with the same reference numbers, and description thereof will not be repeated.

A technique disclosed in this disclosure may be applied to a power converting apparatus for boosting a direct current (DC) or a power converting system of a power converting apparatus. In detail, the technique disclosed in this disclosure may be applied to a multi-phase DC boosting power converting apparatus including a resonant inductor. In particular, the technique may be advantageously applied to a 4-phase interleaved DC/DC converter as a resonant converter using a zero voltage switching (ZVS) scheme and may also be advantageously applied to a printed circuit board (PCB) on which such a power converting apparatus is configured, and a power converting apparatus configured on a PCB. However, the technique disclosed in this disclosure may not be limited thereto and may also be applied to any power converting apparatus to which a technical concept of the technique is applicable, a DC booster, a power converting apparatus including the DC booster, a power control device, a power converting system of a power converting apparatus, a power control system of a power control device, and even a power converting unit having a form and structure different from those of an embodiment described in this disclosure.

Technical terms used in this specification are used to merely illustrate specific embodiments, and should be understood that they are not intended to limit the present disclosure. As far as not being defined differently, all terms used herein including technical or scientific terms may have the same meaning as those generally understood by an ordinary person skilled in the art to which the present disclosure belongs to, and should not be construed in an excessively comprehensive meaning or an excessively restricted meaning. In addition, if a technical term used in the description of the present disclosure is an erroneous term that fails to clearly express the idea of the present disclosure, it should be replaced by a technical term that can be properly understood by the skilled person in the art. In addition, general terms used in the description of the present disclosure should be construed according to definitions in dictionaries or according to its front or rear context, and should not be construed to have an excessively restrained meaning.

A singular representation may include a plural representation as far as it represents a definitely different meaning from the context. Terms 'include' or 'has' used herein should be understood that they are intended to indicate an existence of several components or several steps, disclosed in the specification, and it may also be understood that part of the components or steps may not be included or additional components or steps may further be included.

Embodiments of the present invention will be described below in detail with reference to the accompanying drawings where those components are rendered the same reference number that are the same or are in correspondence, regardless of the figure number, and redundant explanations are omitted.

In describing the present invention, if a detailed explanation for a related known function or construction is considered to unnecessarily divert the gist of the present invention, such explanation has been omitted but would be understood by those skilled in the art. The accompanying drawings are used to help easily understood the technical idea of the present invention and it should be understood that the idea of the present invention is not limited by the accompanying drawings.

In one embodiment, a power converting apparatus for boosting a DC voltage may be configured as illustrated in FIGS. 1 to 4. However, such a power converting apparatus may be various disadvantages.

The DC boosting apparatus is an apparatus for boosting a low voltage to a high voltage. The DC boosting apparatus converts an applied DC voltage into an AC voltage and boosts the converted AC voltage into a DC voltage again. A voltage may be boosted through a boosting transformer, or a DC voltage may be converted into multi-phase AC voltages, the multi-phase AC voltages are rectified and smoothed and converted into a single-phase DC voltage to output a high DC voltage. A device for boosting a battery such as a fuel cell uses the latter method.

Figure 2:
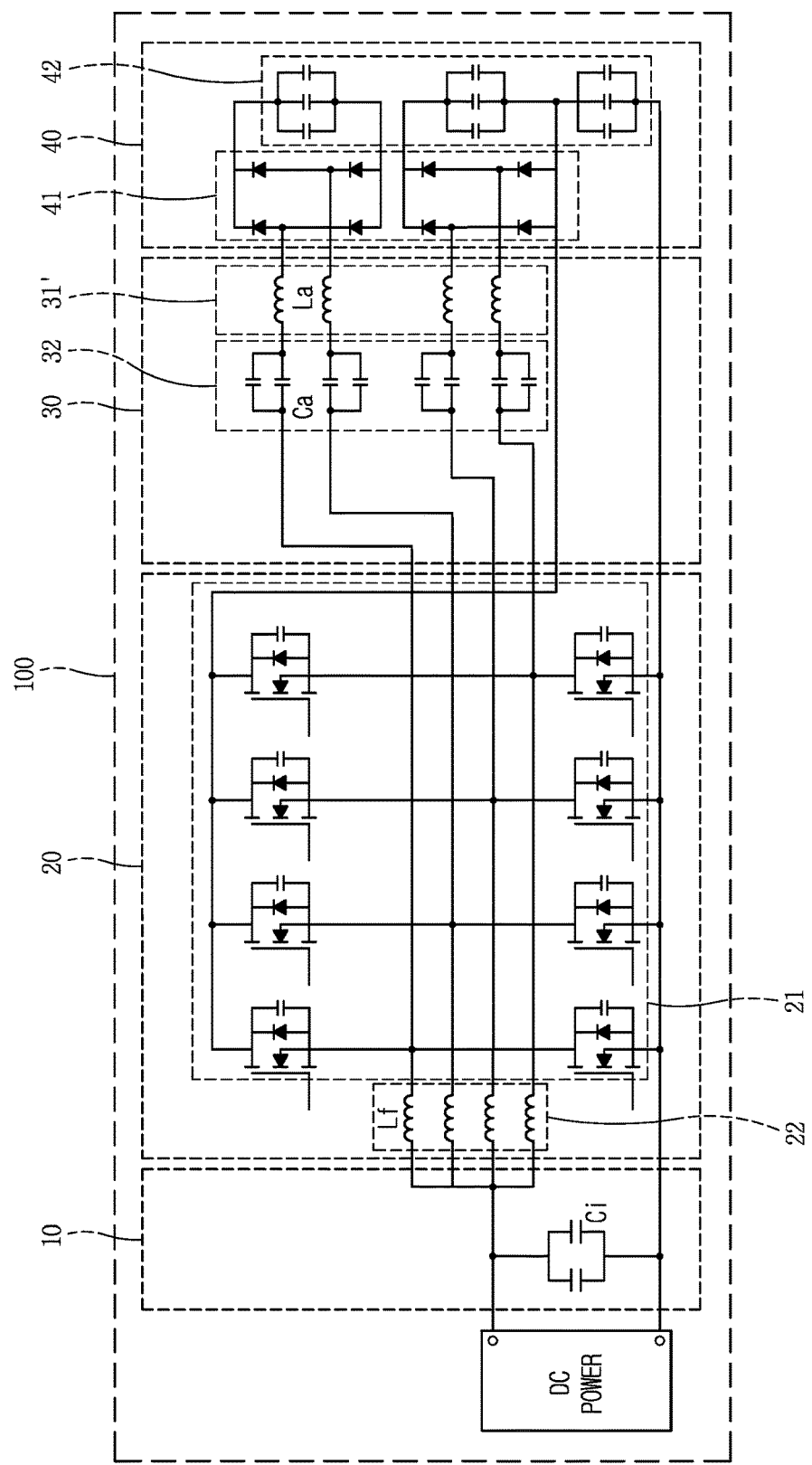
FIG. 2 is a circuit diagram illustrating components of the power converting apparatus illustrated in FIG. 1.
Figure 3:
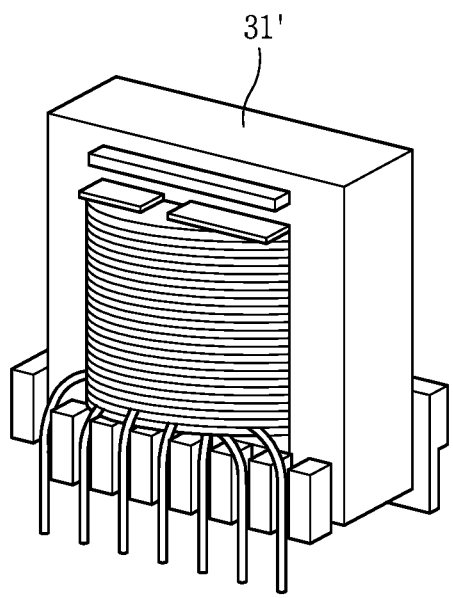
FIG. 3 is a view illustrating a shape of a resonant inductor included in the power converting apparatus illustrated in FIG. 1.
Figure 4:
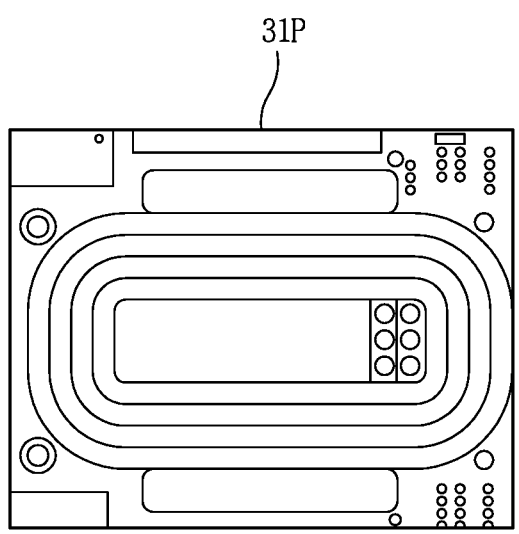
FIG. 4 is a view illustrating a pattern of a PCB in which the resonant inductor illustrated in FIG. 3 is disposed.

FIG. 1 is a view illustrating components on a printed circuit board (PCB) of the related art power converting apparatus. FIG. 2 is a circuit diagram illustrating components of the power converting apparatus illustrated in FIG. 1. FIG. 3 is a view illustrating a shape of a resonant inductor included in the power converting apparatus illustrated in FIG. 1. FIG. 4 is a view illustrating a pattern of a PCB in which a plurality of the resonant inductor illustrated in FIG. 3 are disposed.

As illustrated in FIG. 1, the power converting apparatus of this embodiment is configured on the PCB, and specific circuit components thereof are illustrated in FIG. 2. The power converting apparatus may include an input unit 10 for receiving a DC voltage from the outside, a conversion unit 20 including a plurality of switching circuits 21 for converting the input DC voltage into multi-phase AC voltage, a resonant unit 30 that includes a plurality of resonant inductors 31' connected to the plurality of switching circuits 21, and an output unit 40 for rectifying an AC voltage of each phase converted in the plurality of switching circuits 21 and outputting a single-phase DC voltage.

Here, the resonant unit 30 may be a circuit including the plurality of resonant inductors 31' and a plurality of capacitors 32 connected to the plurality of switching circuits 21 to form a resonance frequency in resonance with a switching frequency of respective ones of the plurality of switching circuits 21. The resonating unit 30 may reduce switching loss of the plurality of switching circuits 21 to allow the plurality of switching circuits 21 to perform a zero voltage switching (ZVS) operation.

A plurality of resonant inductors 31' may be inductors having a core formed as illustrated in FIG. 3 and are configured to be connected respective ones of to the plurality of switching circuits 21 on the PCB as illustrated in FIG. 1. The resonant inductors 31' may be disposed on a printed pattern 31p and wound by a plurality of turns or greater on the PCB to provide (form) inductance components to the switching circuits connected thereto, respectively.

However, the circuit components of the power converting apparatus of this embodiment may have the following limitations and disadvantages.

First, since a different resonant inductor is provided for each of the switching circuits that form each phase, a resonant inductance component for each phase may have a different value. Since the resonant inductance component may have a different value in each phase, uniform resonance cannot be formed. Thus, switching performance of each phase may be different and switching losses cannot be stably reduced through formation of resonance.

Second, due to a difference in resonant performance of each phase, boosting and outputting of a DC voltage cannot be stably performed. Since switching-converted AC voltage in each phase may be different, a DC voltage output from the output terminal may not be stable as significant ripples may result.

Third, since a plurality of resonant inductors is required, there is difficulty in design and manufacturing the power converting apparatus. There is a restriction in placing and designing elements that form the power converting apparatus on a PCB due to structural restrictions of the PCB (e.g., desired size and shape of the PCB). For example, in a case where a large number of resonant inductors are required to correspond to the number of the plurality of switching circuits, a size of the board or the number of components may be undesirably increased, making it difficult to reduce a size of the power converting apparatus. Moreover, since multi-phase signals are needed which increases the number of circuit components disposed, the circuit configuration is complicated and it becomes increasingly difficult to manufacture the PCB (pattern printing) to form the power converting apparatus. Hence, design and manufacture of the power converting apparatus becomes complex and difficult, and results in increased component costs as well as design and manufacturing costs.

That is, due to the functional/structural restrictions, the power converting apparatus of this embodiment may have limitations in switching performance, design, and manufacturing, and thus, miniaturization and performance improvement are also limited. As a result, the circuit configuration of such power converting apparatus cannot ensure desired stability, reliability, utilization, and utility.

Hereinafter, a power converting system and a power converting apparatus according to a second embodiment will be described with reference to FIGS. 5 to 11.

Figure 5:
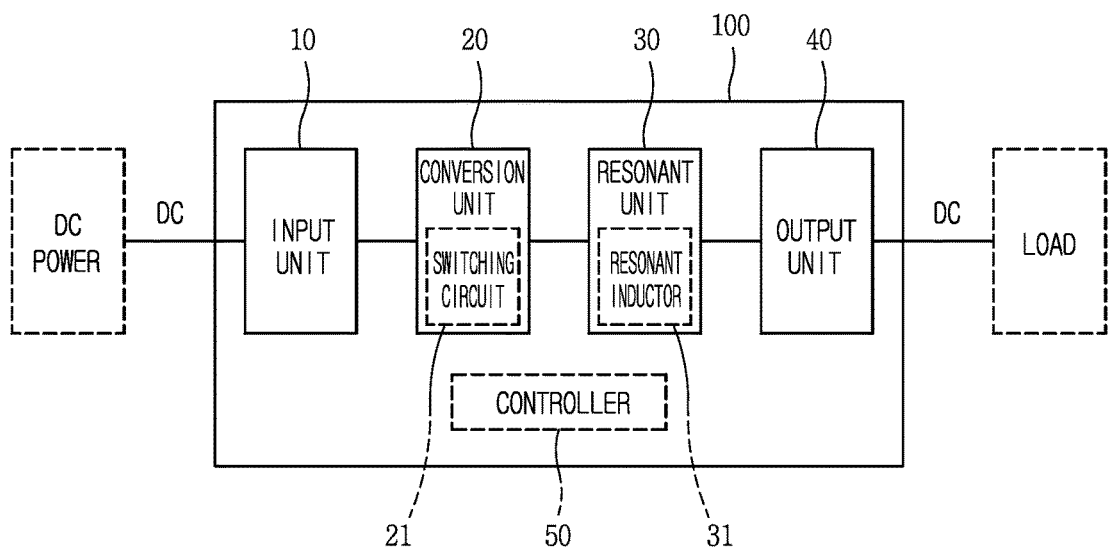
FIG. 5 is a block diagram of a power converting system and a power converting apparatus of one embodiment.
Figure 6:
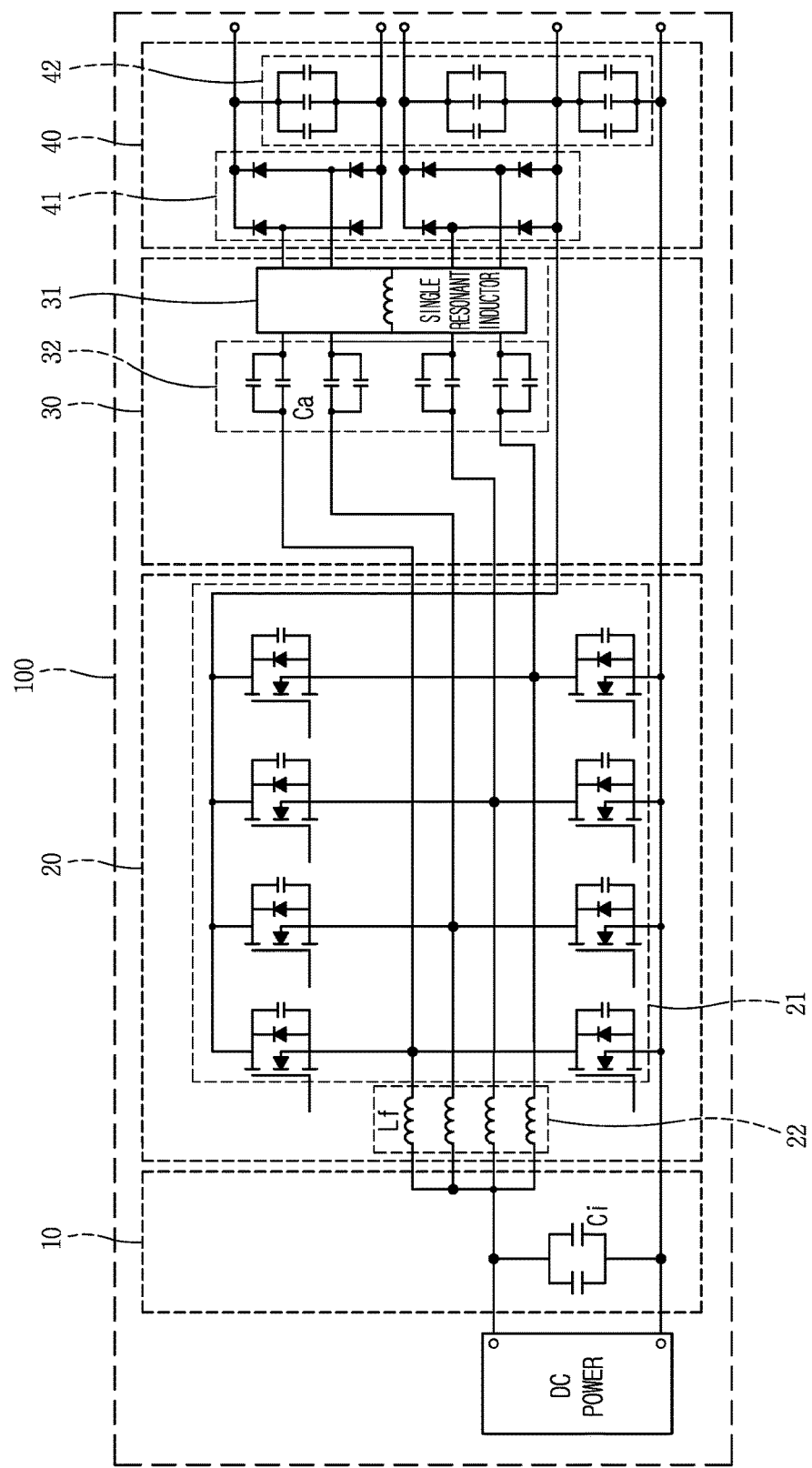
FIG. 6 is a circuit diagram illustrating a circuit configuration according to the embodiment of the power converting system and the power converting apparatus illustrated in FIG. 5.
Figure 7:
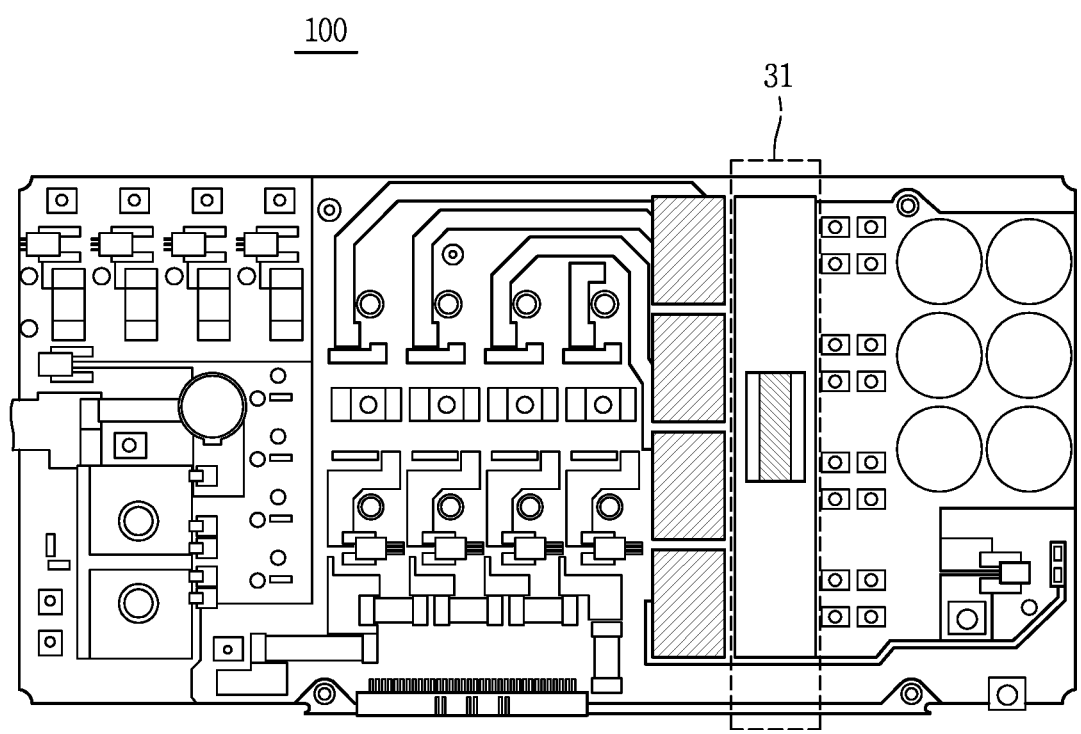
FIG. 7 is a view illustrating a configuration of a power converting system and a power converting apparatus disclosed on a PCB.
Figure 8:
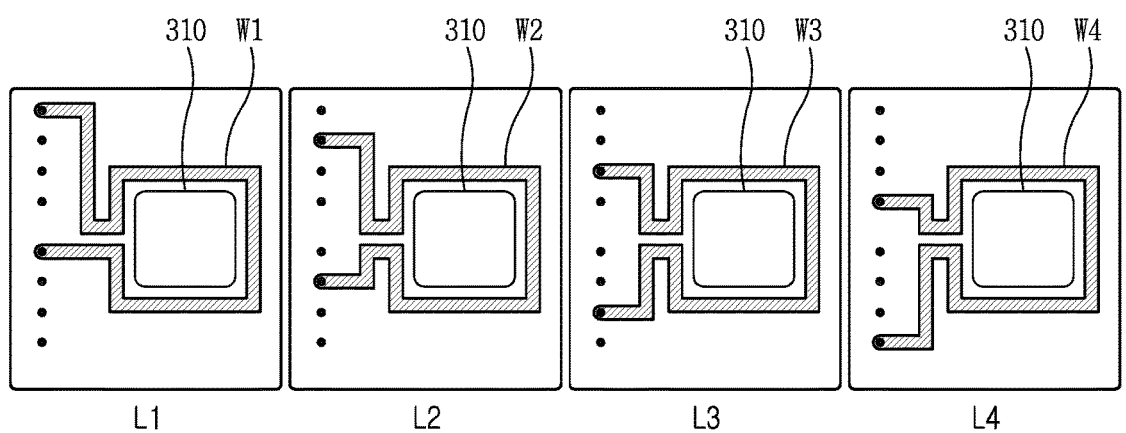
FIG. 8 is a view illustrating an example of an electric line pattern according to an embodiment of a power converting system and a power converting apparatus.
Figure 9:
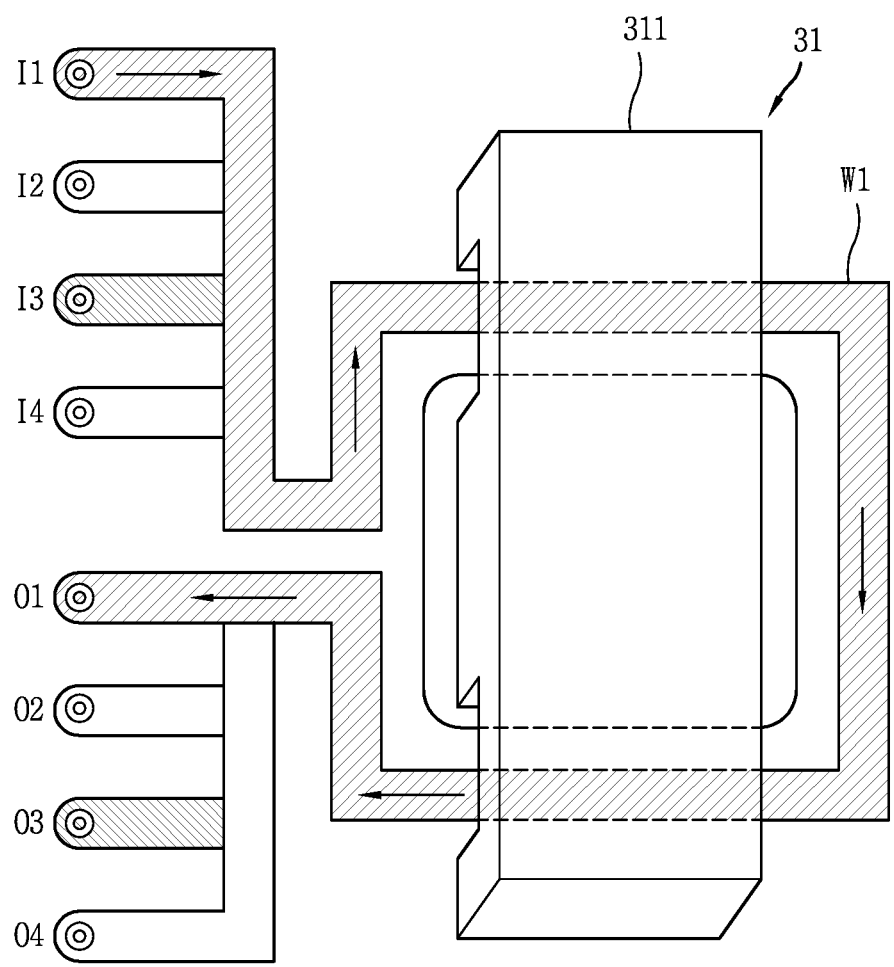
FIG. 9 is a view illustrating connection of a resonant inductor according to an embodiment of a power converting system and a power converting apparatus.

FIG. 5 is a block diagram of a power converting system and a power converting apparatus of a second embodiment. FIG. 6 is a circuit diagram illustrating a circuit configuration of the power converting system and the power converting apparatus illustrated in FIG. 5. FIG. 7 is a view illustrating a configuration of a power converting system and a power converting apparatus on a PCB. FIG. 8 is a view illustrating an example of an electric line (trace) pattern of a power converting system and a power converting apparatus. FIG. 9 is a view illustrating connection of a resonant inductor of a power converting system and a power converting apparatus of FIG. 8.

Figure 10A:
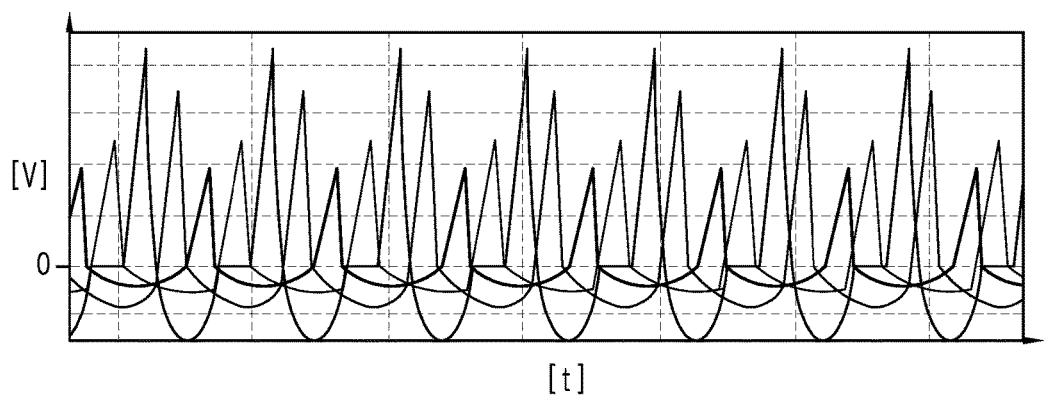
FIG. 10A is a graph illustrating a simulation result of switching waveforms of the power converting apparatus of FIGS. 1-4.
Figure 10B:
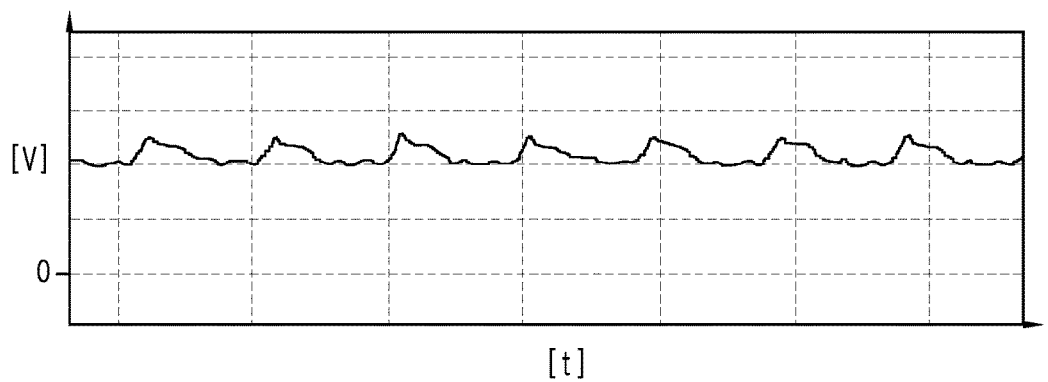
FIG. 10B is a graph illustrating a simulation result of output waveforms of the power converting apparatus of FIGS. 1-4.
Figure 11A:
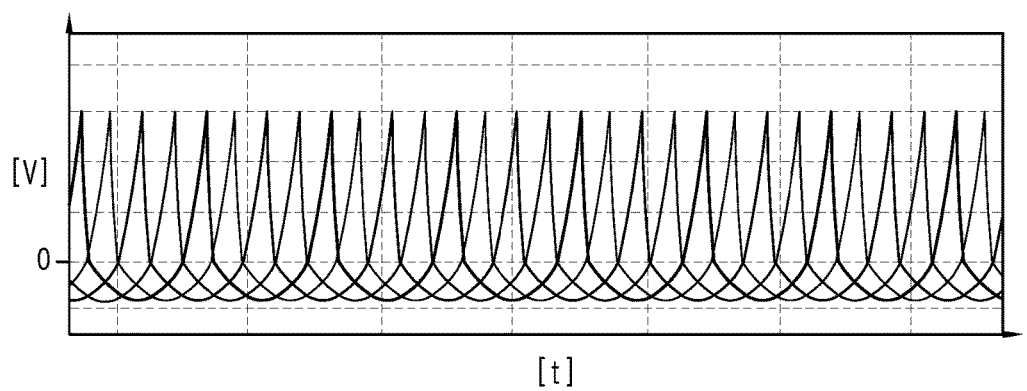
FIG. 11A is a graph illustrating a simulation result of switching waveforms of a power converting system and a power converting apparatus of FIGS. 5-9.
Figure 11B:
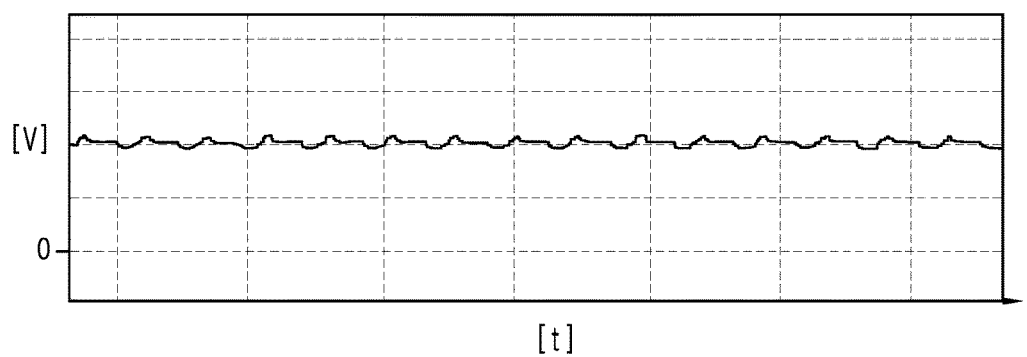
FIG. 11B is a graph illustrating a simulation result of output waveforms of a power converting system and a power converting apparatus of FIGS. 5-9.

FIG. 10A is a graph illustrating a simulation result of switching waveforms of the power converting apparatus and FIG. 10B is a graph illustrating a simulation result of output waveforms of the power converting apparatus of the first embodiment as illustrated in FIGS. 1-4. FIG. 11A is a graph illustrating a simulation result of switching waveforms of a power converting system and a power converting apparatus and FIG. 11B is a graph illustrating a simulation result of output waveforms of a power converting system and a power converting apparatus of the second embodiment as illustrated in FIGS. 5-9.

A power converting apparatus refers to an apparatus for boosting a DC voltage, and a power converting system refers to a power converting system of the apparatus for boosting a DC voltage. The power converting apparatus may be a DC boosting converter which converts a single-phase DC voltage into multi-phase AC voltage, boosts the same, and converts the boosted AC voltage into a single-phase DC voltage again.

The power converting apparatus may be a fuel cell, a battery, or an apparatus which receives DC power of a low voltage and boosts the received DC power by 10 times or more.

The power converting apparatus may be configured in the form of a module on a printed circuit board (PCB). The power converting apparatus may be configured as a module on the PCB and included in an apparatus that consumes DC power. The power converting apparatus may include a plurality of circuit elements for boosting a DC voltage or a circuit module.

A power converting system 100 disclosed in this disclosure refers to a system applied to the power converting apparatus 100 as illustrated in FIG. 5. The power converting system 100 may include an input unit 10 receiving a DC voltage from the outside, a conversion unit 20 including a plurality of switching circuits 21 converting the input DC voltage into multi-phase AC voltage, a resonant unit 30 including a single resonant inductor 31 connected to the plurality of switching circuits 21, and an output unit 40 rectifying an AC voltage of each phase converted in the plurality of switching circuits 21 and outputting a single-phase DC voltage.

That is, the power converting system 100 may be a power converting system including the input unit 10, the conversion unit 20, the resonant unit 30, and the output unit 40 and may include a power converting apparatus including the input unit 10, the conversion unit 20, the resonant unit 30, and the output unit 40.

The power converting system 100 may further include a controller 50 controlling a switching operation of the plurality of switching circuits 21. The controller 50 may control a switching operation of the plurality of switching circuits 21 on the basis of a result of detecting a current and a voltage of the input unit 10 or the output unit 40 to control power conversion of the power converting apparatus 100.

A specific circuit configuration of the power converting system 100 is illustrated in FIG. 6. The input unit 10 may receive a DC voltage from an external DC power source. The input unit 10 may include a smoothing capacitor smoothing the received DC voltage.

The conversion unit 20 may include a plurality of switching circuits 21 and convert the DC voltage input to the input unit 10 into a multi-phase AC voltage through the plurality of switching circuits 21. The plurality of switching circuits 21 may convert the DC voltage into a multi-phase AC voltage through a switching operation.

Each of the plurality of switching circuits 21 may receive the input DC voltage through a branched circuit and convert the DC voltage into an AC voltage of each phase. The plurality of switching circuits 21 may be four or more switching circuits. The plurality of switching circuits 21 may be four or more switching circuits which respectively convert the input DC voltage into AC voltages of four or more phases.

That is, the power converting system 100 may be a DC/DC converter system which converts and boosts the input DC voltage into AC voltages of four or more phases through the plurality of switching circuits 21 configured as four or more switching circuits 21. The power converting system 100 may be a four-phase interleaved DC/DC converter system which preferably includes four or more switching circuits to convert the input DC voltage into a four-phase AC voltage.

The plurality of switching circuits 21 may perform a switching operation to be turned on or off according to an operation signal transmitted from the controller 50 or a control unit controlling the power converting apparatus 100 to convert the input DC voltage into an AC voltage. Here, the operation signal may be a control signal regarding switching frequencies of the plurality of switching circuits 21.

The conversion unit 20 may further include a plurality of charge inductors 22 storing the input DC voltage and transmitting the DC voltage to the plurality of switching circuits 21, respectively. The plurality of charge inductors 22 may correspond to a number of the plurality of switching circuits 21.

The plurality of charge inductors 22 may be connected to the plurality of switching circuits 21, respectively, to transmit the input DC voltage to the plurality of switching circuits 21. That is, one charge inductor 22 and one switching circuit 21 may form one branch circuit to form one phase of the AC voltage.

The resonant unit 30 may be a circuit forming a resonance frequency in resonance with the switching frequency of the plurality of switching circuits 21. That is, the resonant unit 30 may be a circuit which reduces switching loss of the plurality of switching circuits 21.

Due to formation of the resonance frequency of the resonant unit 30, the plurality of switching circuits 21 may perform a zero voltage switching (ZVS) operation. The resonant unit 30 may include an inductance (L) element or a capacitance (C) element for forming the resonance frequency.

That is, the resonant unit 30 may include the inductance element or the capacitance element, and an influence of an inductance value by the inductance element and an influence of a capacitance value by the capacitance element forming the resonance frequency are transmitted to the plurality of switching circuits 21 so that a resonance influence may be transmitted to the plurality of switching circuits 21.

The resonant unit 30 may include a single resonant inductor 31 connected to the plurality of switching circuits 21. For example, in contrast to the plurality of resonant inductors 31' of FIGS. 1 and 2, the resonant unit 30 of the present embodiment may have a single resonant inductor 31.

The resonant inductor 31 may be an inductor having an inductance value for forming the resonance frequency. That is, the resonant unit 30 may include the single resonant inductor 31 connected to the plurality of switching circuits 21 to form a resonance frequency through the single resonant inductor 31.

The resonant inductor 31 and resonant capacitors 32 may be coupled to output terminals of the plurality of switching circuits 21 by windings W1-W4. The windings W1-W4 may be commonly coupled in the resonant inductor 31. For example, each winding W1, W2, W3, and W4 may be wound around a common core 311 of the single resonant inductor 31.

As the windings connected to the plurality of switching circuits 21 are commonly connected to the resonant inductor 31, the plurality of switching circuits 21 are commonly affected by an inductance of the single resonant inductor 31, and thus, the plurality of switching circuits 21 may have the same inductance value.

In this case, windings of the plurality of switching circuits 21 may be connected in an insulated state to the resonant inductor 31. The windings respectively connected to the plurality of switching circuits 21 commonly connected to the resonant inductor 31 may be connected to an input terminal of the output unit 40.

That is, the windings connected to the plurality of switching circuits 21 and the output unit 40 may be commonly connected to the resonant inductor 31 disposed between the plurality of switching circuits 21 and the output unit 40. The winding may be connected to the resonant inductor 31 such that it is wound around the core 311 of the resonant inductor 31.

Since each of the windings are wound in the resonant inductor 31 in a common manner, inductance of the resonant inductor 31 may appear on the windings so that an inductance value is in proportion to the number of windings.

The resonant inductor 31 may be an inductor having an inductance value in a [uH] unit. The windings may be wound around in the resonant inductor 31 such that the winding connected to the output terminal of each of the plurality of switching circuits 21 and an input terminal of each phase of the output unit 40 have an inductance value of about 2 [uH].

Each winding connected to the output terminal of each of the plurality of switching circuits 21 and the input terminal of each phase of the output unit 40 may be wound around in the resonant inductor 31 at least one or more times.

The winding may be wound around the resonant inductor 31 one time to have an inductance value of 2 [uH], preferably. For example, since the winding connected to each of the plurality of switching circuits 21 is wound around the single resonant inductor core 311 one time in an insulated state, the same inductance value 2 [uH] may be formed in each of the plurality of switching circuits 21.

The resonant unit 30 may further include a plurality of resonant capacitors 32 respectively connected to the plurality of switching circuits 21. The plurality of resonant capacitors 32 may be capacitors having a capacitance value in resonance with the resonant inductor 31.

The plurality of capacitors 32 corresponding to the same number of the plurality of switching circuits 21 may be provided. That is, the resonating unit 30 may include one resonant inductor 31 and a plurality of resonant capacitors 32 corresponding to the number of the plurality of switching circuits 21. The plurality of resonant capacitors 32 may be disposed between the plurality of switching circuits 21 and the resonant inductor 31.

The resonant unit 30 may form the resonance frequency in resonance with a switching frequency of the plurality of switching circuits 21 through the resonant inductor 31 and the plurality of capacitors 32 connected to the plurality of switching circuits 21.

The output unit 40 may be coupled to respective ones of the plurality of switching circuits 21 to receive an AC voltage of each phase converted in the plurality of switching circuits 21. The output unit 40 may rectify the AC voltage of each phase converted in the plurality of switching circuits 21 and output a single-phase DC voltage.

The output unit 40 may include a rectifying unit 41 that rectifies the AC voltage of each phase converted in the plurality of switching circuits 21 and a smoothing unit 42 that smooths the a rectified voltage from the rectifying unit 41.

The rectifying unit 41 may include a plurality of inputs and a plurality of rectifying diodes rectifying the AC voltage of each phase converted in the plurality of switching circuits 21 into a DC voltage. The smoothing unit 42 may include a plurality of smoothing capacitors for smoothing a rectified voltages from the rectifying unit 41. The DC voltage smoothed in the output unit 40 may be output as a single-phase DC voltage through both ends of the smoothing unit 42.

The power converting apparatus disclosed in this disclosure may be configured on a multi-layer PCB. As illustrated in FIG. 6, the power converting apparatus 100 configured on the PCB may include an input unit 10 receiving a DC voltage from an external DC source, a plurality of switching circuits 21 connected to the output end of the input unit 10 and converting the DC voltage input to the input unit 10 into a multi-phase AC voltage, an output unit 40 connected to the output end of each of the plurality of switching circuits 21 and configured to rectify an AC voltage of each phase converted in each of the plurality of switching circuits 21 to output a single-phase DC voltage, and a single resonant inductor 31 disposed in an electric line (trace) to which the output end of each of the plurality of switching circuits 21 and the input end of each phase of the output unit 40 are connected.

A detailed circuit configuration of the power converting apparatus 100 configured on the PCB may be the same as the embodiment of the power converting system 100 described above.

The PCB may have a printed copper foil pattern forming an electric line or trace. A plurality of circuit elements may be disposed along the printed copper foil pattern. In the power converting apparatus 100, a plurality of circuit elements forming the power converting apparatus 100 may be disposed along the copper foil pattern printed on the PCB and element disposition positions. That is, the input unit 10, the plurality of switching circuits 21, the output unit 40, and the resonant inductor 31 may be disposed on the PCB along the printed copper foil pattern on the PCB.

The input unit 10 may include a smoothing capacitor Ci for smoothing a received DC voltage. An input end of the input unit 10 may be connected to an external DC power source and an output end thereof may be connected to the conversion unit 20 that includes the plurality of switching circuits 21.

The conversion unit 20 may include a plurality of charging inductors 22 storing the input DC voltage and transmitting the stored DC voltage to the plurality of switching circuits 21. The output end of the input unit 10 may be connected to the plurality of charging inductors 22. The input unit 10 may transmit the received DC power to each of the plurality of charging inductors 22.

The input end of each of the plurality of charging inductors 22 may be connected to the output end of the input unit 10 and the output end thereof may be connected to each of the plurality of switching circuits 21. Each of the plurality of charging inductors 22 may store DC power received from the input unit 10 and transmit the stored DC power to each of the plurality of switching circuits 21.

The input end of each of the plurality of switching circuits 21 may be connected to the output end of each of the plurality of charging inductors 22, and the output end of the plurality of switching circuits 21 may be connected to the resonant unit 30 that includes the resonant inductor 31.

The resonant unit 30 may include a plurality of resonant capacitors 32 respectively connected to the plurality of switching circuits 21, and the output end of each of the plurality of switching circuits 21 may be connected to each of the plurality of resonant capacitors 32.

The resonant unit 30 may form the resonance frequency in resonance with a switching frequency of the plurality of switching circuits 21 through the resonant inductor 31 and the plurality of capacitors 32 connected to the plurality of switching circuits 21.

Each of the plurality of switching circuits 21 may convert a DC voltage received from the input unit 10 into an AC voltage of each phase and transmit the converted AC voltage to the output unit 40.

The input end of the output unit 40 may be connected to the output end of the plurality of switching circuits 21 connected to the resonant unit 30, so that the output unit 40 may receive an AC voltage of each phase converted in the plurality of switching circuits 21.

The output unit 40 may rectify the AC voltage of each phase converted in the plurality of switching circuits 21 and output a single-phase DC voltage. The output unit 40 may include the rectifying unit 41 and the smoothing unit 42. The input end of the rectifying unit 41 may be connected to the output end of each of the plurality of switching circuits 21 through the resonant unit 30 to rectify the AC voltage of each phase converted in the plurality of switching circuits 21 into a DC voltage. The smoothing unit 42 may be connected to the output end of the rectifying unit 41 to smooth a rectified voltage from the rectifying unit 41.

The rectifying unit 41 may include a plurality of rectifying diodes rectifying the AC voltage of each phase converted in the plurality of switching circuits 21 into a DC voltage. The smoothing unit 42 may include a plurality of smoothing capacitors for smoothing the rectified voltage from the rectifying unit 41. In the output unit 40, the smoothed DC voltage may be output as a DC voltage of a single phase through both ends of the smoothing unit 42.

An example in which the power converting apparatus 100 is configured on the PCB is illustrated in FIG. 7. The power converting apparatus 100 may have the circuit configuration as described above. The PCB on which the power converting apparatus 100 is configured may be a board having a multilayer structure. The multiple layers of the PCB may be insulated layers that are stacked. The plurality of switching circuits 21 may be disposed on the plurality of insulated layers of the PCB, respectively.

For example, the PCB may be a board having a 4-layer structure, and the plurality of switching circuits 21 may convert the input DC voltage into AC voltages of four phases. The plurality of switching circuits 21 may be disposed on the four layers of the PCB, respectively, to convert the input DC voltage into an AC voltage in each layer.

The PCB may be a board having a four-layer structure, and each of the plurality of switching circuits 21 may be disposed on different ones of the four layers. Each of the plurality of switching circuits 21 may convert a respective input voltage into an AC voltage. Hence, the power converting apparatus 100 may convert the input DC voltage into AC voltages of four phases.

For example, among the plurality of switching circuits 21, a first switching circuit may be disposed on a first layer of the PCB, a second switching circuit may be disposed on a second layer of the PCB, a third switching circuit may be disposed on a third layer of the PCB, and a fourth switching circuit may be disposed on a fourth layer of the PCB, and AC voltages of a total of four phases may be converted in the switching circuits, respectively.

An electric line or trace to which the output end of each of the plurality of switching circuits 21 and an input end of each phase of the output unit 40 are connected may be printed in a pattern and formed to wind around the core in the resonant inductor 31 at least one time.

Since the electric line or trace is printed to form a winding around the core in the resonant inductor 31, inductance of the resonant inductor 31 appears on the electric line or trace. Here, an inductance value is in proportion to the number of times the electric line or trace is wound in the resonant inductor.

The electric line or trace may be printed on each layer of the PCB to overlap a position in which the resonant inductor 31 is disposed. For example, as illustrated in FIG. 8, the electric line or trace W1 to W4 may be printed in a pattern which winds around a position 310 on the PCB for the core in the resonant inductor 31 one time on each of the layers L1 to L4 of the PCB. Also, as illustrated in FIG. 9, the electric lines or traces may be printed to have the same shape around the position 310 where the core of the resonant inductor 31 is disposed. Hence, each of the electric lines W1 to W4 printed on each of the respective layers are wound in the resonant inductor 31 one time, in the same manner.

The resonant inductor 31 may be disposed in a position in which the electric lines are printed to overlap each other. As illustrated in FIG. 9, the resonant inductor 31 may be disposed in a position in which the electric lines are printed to overlap each other, and the electric lines to which the output end of each of the plurality of switching circuits 21 and the input end of each phase of the output unit 40 are connected may be wound around the core in the resonant inductor 31 at least one time.

The electric line may wind around the resonant inductor 31 one time to have an inductance value of 2[uH], preferably. That is, since the electric lines to which the output end of each of the plurality of switching circuits 21 and the input end of each phase of the output unit 40 are connected are wound around the resonant inductor 31 in an insulated state, the same inductance value 2 [uH] may be formed for each of the plurality of switching circuits 21.

In this manner, since the resonant inductor 31 affecting resonance of the plurality of switching circuits 21 is configured as a single resonant inductor and the electric lines to which the plurality of switching circuits 21 are connected respectively are connected to the single resonant inductor 31, the same resonance inductance may be formed in the plurality of switching circuits 21. Since the same resonance inductance is formed in each phase in which a DC voltage is converted into an AC voltage, an error in switching loss in each phase may be reduced to ensure a stable and effective power conversion.

The waveforms illustrated in FIGS. 10 and 11 illustrate an effect of the embodiment described above. FIGS. 10A and 10B illustrate switching waveforms and DC output waveforms when different resonance inductance values are formed by different resonance inductors and provided to each phase, and FIGS. 11A and 11B illustrate switching waveforms and DC output waveforms when the same resonance inductance value is formed through a single resonant inductor.

When comparing FIGS. 10A and 11A illustrating switching waveforms of the plurality of switching circuits 21, it can be seen that, in case where different resonance inductance values are formed for each phase (FIG. 10A), the switching waveforms of the phases appear to be unstable. In contrast, in the case where the same resonance inductance value is formed (FIG. 11A), the switching waveforms of the different phases are more stable and uniform.

When comparing FIGS. 10B and 11B illustrating DC voltage waveforms, it can be seen that, in case where different resonance inductance values are formed in each phase (FIG. 10B), a significant ripples are generated to result in an output that is unstable. In contrast, in a case where the same resonance inductance value is formed for each phase (FIG. 11B), ripples are reduced and the output is stable.

As a result, since the single resonance inductor 31 is used, the same resonance inductance is formed in the switching circuits for each phase, making power conversion switching stable, reducing switching loss, and significantly reducing ripples in an output of DC voltage. Thus, the DC voltage may be more stably boosted and output.

The embodiments of the power converting system and power converting apparatus disclosed in this disclosure may be applied to a power converting system and a power converting apparatus which boosts a DC.

The embodiments of the power converting system and power converting apparatus disclosed in this disclosure may be applied to a multi-phase DC boosting power converting apparatus including a resonant inductor and may particularly be applied to a 4-phase interleaved DC/DC converter as a resonant converter advantageously using a zero voltage switching (ZVS) scheme.

The embodiments of the power converting system and power converting apparatus disclosed in this disclosure may be applied to a PCB in which the power converting device is configured on a PCB.

In the embodiments of the power converting system and power converting apparatus disclosed in this disclosure, since the plurality of switching circuits that respectively form different phases are commonly connected to a single resonant inductor, the same resonance inductance value may be formed in each phase.

Thus, since switching loss, as well as an error of switching loss in each phase, is reduced, stable power conversion switching may be performed.

In the embodiments of the power converting system and power converting apparatus disclosed in this disclosure, since the plurality of switching circuits respectively forming phases are commonly connected to the single resonant inductor, a resonance inductance value of each phase may be designed without error. That is, a circuit configuration and design for forming a resonance frequency may be simplified and more easily made, and performance in reducing switching loss may be improved. Thus, the power converting apparatus may be more easily designed and manufactured and costs therefor may be reduced.

Also, in the embodiments of the power converting system and power converting apparatus disclosed in this disclosure, reliability, stability, utilization, and utility of the power converting apparatus may be increased through the effects described above.

Therefore, an aspect of the detailed description is to provide a power converting system and a power converting apparatus having a circuit configuration in which a resonant inductance value of each phase is designed without an error.

Another aspect of the detailed description is to provide a power converting system and a power converting apparatus having a circuit configuration capable of improving switching loss reduction performance of a power converting unit.

Another aspect of the detailed description is to provide a power converting system and a power converting apparatus having a circuit configuration in which components on a printed circuit board are simplified.

In an aspect, a power converting system and power converting apparatus use a single resonant inductor.

In detail, a plurality of switching circuits respectively forming phases are commonly connected to the single resonant inductor. That is, since the single resonant inductor is used in a circuit configuration of the power converting apparatus, the same resonance inductance value may be provided to each phase.

To achieve these and other advantages and in accordance with the purpose of this specification, as embodied and broadly described herein, a power converting system applied to a power converting apparatus may include: an input unit receiving a direct current (DC) voltage from the outside; a conversion unit including a plurality of switching circuits converting the input DC voltage into a multi-phase AC voltage; a resonant unit including a single resonant inductor connected to the plurality of switching circuits; and an output unit rectifying an AC voltage of each phase which has been converted in the plurality of switching circuits and outputting a single DC voltage.

In an embodiment, the plurality of switching circuits may be four or more switching circuits to convert the input DC voltage into AC voltages of four phases or greater.

In an embedment, the conversion unit may further include a plurality of charging inductors storing the input DC voltage and transmitting the stored DC voltage to the plurality of switching circuits, respectively.

In an embodiment, windings respectively connected to the plurality of switching circuits may be commonly connected to the resonant inductor.

In an embodiment, a winding to which an output terminal of each of the plurality of switching circuits and an input terminal of each phase of the output unit are connected may wind around the resonant inductor at least one time.

In an embodiment, the resonant unit may further include a plurality of resonant capacitors respectively connected to the plurality of switching circuits.

In an embodiment, the plurality of resonant capacitors may be capacitors having a capacitance value resonated with the resonant inductor.

To achieve these and other advantages and in accordance with the purpose of this specification, as embodied and broadly described herein, a power converting apparatus configured on a multi-layer printed circuit board (PCB) may include: an input unit receiving a direct current (DC) voltage from the outside; a plurality of switching circuits connected to the other end of the input unit and converting the DC voltage input to the input unit into multi-phase AC voltages; an output unit connected to the other end of each of the plurality of switching circuits and rectifying an AC voltage of each phase converted in each of the plurality of switching circuits to output a single-phase DC voltage; and a single resonant inductor disposed in an electric line to which the other end of each of the plurality of switching circuits and one end of each phase of the output unit are connected.

In an embodiment, the PCB may have a printed copper foil pattern forming an electric line and a plurality of circuit elements may be disposed along the printed copper foil pattern.

In an embodiment, the PCB may be a board having a 4-layer structure, and the plurality of switching circuits may convert the input DC voltage into AC voltages of four phases.

In an embodiment, the plurality of switching circuits may be disposed on the four layers of the PCB, respectively, to convert the input DC voltage into an AC voltage in each layer.

In an embodiment, an electric line to which the other end of each of the plurality of switching circuits and one end of each phase of the output unit are connected may be printed in a pattern of winding around the resonant inductor at least one time.

In an embodiment, the electric line may be printed on each layer of the PCB to overlap a position in which the resonant inductor is disposed.

In an embodiment, the electric lines to which the other end of each of the plurality of switching circuits and one end of each phase of the output unit are connected may wind around the resonant inductor at least one time.

As described above, in the power converting system and power converting apparatus disclosed in this disclosure, since the plurality of switching circuits respectively forming phases are commonly connected to the single resonant inductor, the same resonance inductance value may be formed in each phase.

Thus, since switching loss, as well as an error of switching loss in each phase, is reduced, stable power conversion switching may be performed.

Also, in the power converting system and power converting apparatus disclosed in this disclosure, since the plurality of switching circuits respectively forming phases are commonly connected to the single resonant inductor, a resonance inductance value of each phase may be designed without an error.

That is, a circuit configuration and design for forming a resonance frequency may be simplified and easily made, and performance of reducing switching loss may be improved.

Thus, the power converting apparatus may be easily designed and manufactured and cost therefor may be reduced.

Also, reliability, stability, utilization, and utility of the power converting apparatus may be increased through the effects described above.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A power converting system comprising:
an input unit that receives a direct current (DC) voltage from an external power source;
a conversion unit including a plurality of switching circuits that convert the input DC voltage into a multi-phase AC voltage;
a resonant unit including a single resonant inductor, wherein the single resonant inductor is connected to each of the plurality of switching circuits; and
an output unit that rectifies each phase of the multi-phase AC voltage which has been converted in the plurality of switching circuits and outputs a single DC voltage,
wherein the single resonant inductor includes a plurality of windings respectively connected to the plurality of switching circuits, wherein each of the plurality of windings are insulated from each other and wound around a single core, wherein each of the plurality of windings are provided on a separate layer of a printed circuit board (PCB), and wherein each of the plurality of windings have a same shape and are wound around the single core such that they have a same inductance.

2. The power converting system of claim 1, wherein the plurality of switching circuits are four or more switching circuits to convert the input DC voltage into AC voltages of four or more phases.

3. The power converting system of claim 1, wherein the conversion unit includes a plurality of charging inductors storing the input DC voltage and transmitting the stored DC voltage to the plurality of switching circuits, respectively.

4. The power converting system of claim 1, wherein each of the plurality of windings are connected to an output terminal of a corresponding switching circuit and a corresponding input terminal of each phase of the output unit, and are provided to be wound at least one time.

5. The power converting system of claim 1, wherein the resonant unit further includes a plurality of resonant capacitors respectively connected to the plurality of switching circuits.

6. The power converting system of claim 5, wherein the plurality of resonant capacitors are capacitors having a capacitance value in resonance with the single resonant inductor.

7. A power converting apparatus provided on a multi-layer printed circuit board (PCB), the power converting apparatus comprising:

an input circuit that receives a direct current (DC) voltage from an external DC power source;

a plurality of switching circuits connected to an output of the input circuit and configured to convert the DC voltage into a multi-phase AC voltage;

a resonant circuit connected to an output of each of the plurality of switching circuits, the resonant circuit having a plurality of resonant capacitors and a single resonant inductor, wherein the single resonant inductor is connected to each of the plurality of switching circuits; and an output circuit connected to an output of the resonant circuit corresponding to each of the plurality of switching circuits and rectifying an AC voltage of each phase converted in each of the plurality of switching circuits to output a single-phase DC voltage wherein the single resonant inductor is formed by a trace on the PCB that corresponds to the output of each of the plurality of switching circuits and a corresponding input of the output circuit, wherein the trace includes multiple patterns that correspond to each of the plurality of switching circuits, each of the multiple patterns being provided to be separately wound one time around a core on the PCB, wherein each of the multiple patterns of the trace are formed on a different layer of the PCB and vertically overlap each other, and wherein each of the multiple patterns of the trace are formed to have a same shape to provide a same inductance for providing the same resonance for each phase of the multi-phase AC voltage.

8. The power converting apparatus of claim 7, wherein the PCB has a printed copper foil pattern forming the trace and a plurality of circuit elements are disposed along the printed copper foil pattern.

9. The power converting apparatus of claim 7, wherein the PCB is a board having a structure in which a plurality of layers insulated from each other are stacked.

10. The power converting apparatus of claim 7, wherein the PCB is a board having a 4-layer structure, and the plurality of switching circuits are provided on the 4-layer structure to convert the input DC voltage into AC voltages of four phases.

11. The power converting apparatus of claim 10, wherein the plurality of switching circuits are disposed on four different layers of the PCB and converts the input DC voltage into an AC voltage of different phase in each layer.

12. The power converting apparatus of claim 7, wherein the trace is printed in a pattern to wind around the core of the single resonant inductor at least one time.

13. The power converting apparatus of claim 12, wherein the trace is printed on each layer of the PCB to overlap each other at a position in which the single resonant inductor is formed.

* * * * *